(12) United States Patent
Komatsuda (10) Patent No.: US 7,446,856 B2
(45) Date of Patent: Nov. 4, 2008

(54) ILLUMINATION SYSTEMS, EXPOSURE APPARATUS, AND MICRODEVICE-MANUFACTURING METHODS USING SAME

(75) Inventor: Hideki Komatsuda, Ageo (JP)

(73) Assignee: Nikon Corporation, Tokyo (JP)

(*) Notice: Subject to any disclaimer, the term of this patent is extended or adjusted under 35 U.S.C. 154(b) by 430 days.

(21) Appl. No.: 11/281,785

(22) Filed: Nov. 16, 2005

(65) Prior Publication Data

US 2006/0170894 A1    Aug. 3, 2006

(30) Foreign Application Priority Data

Nov. 17, 2004    (JP) .............................. 2004-332769

(51) Int. Cl.
G03B 27/54    (2006.01)
G03B 27/42    (2006.01)

(52) U.S. Cl. .......................................... 355/67; 355/53
(58) Field of Classification Search .................. 355/52, 355/53, 55, 67–71; 359/618–620, 859; 250/548
See application file for complete search history.

(56) References Cited

U.S. PATENT DOCUMENTS

| | | | |
|---|---|---|---|
| 6,195,201 B1 * | 2/2001 | Koch et al. | ..................... 355/67 |
| 6,452,661 B1 | 9/2002 | Komatsuda | |
| 6,833,904 B1 | 12/2004 | Komatsuda | |
| 2003/0031017 A1 | 2/2003 | Tsuji | |
| 2005/0213069 A1 | 9/2005 | Murakami | |

FOREIGN PATENT DOCUMENTS

| WO | 2004/038773 | 6/2004 |
|---|---|---|
| WO | 2004/021086 | 11/2004 |

* cited by examiner

*Primary Examiner*—Hung Henry Nguyen
(74) *Attorney, Agent, or Firm*—Klarquist Sparkman, LLP (57) ABSTRACT

Illumination systems are disclosed that illuminate a surface (M) for irradiation with illumination light emitted from a light source (5). An exemplary illumination system includes an incidence-side reflection-type fly-eye optical system (12) having multiple reflection-type partial optical systems arranged in rows, an emission-side reflection-type fly-eye optical system (14) having multiple reflection-type partial optical systems arranged in rows and corresponding to respective reflection-type partial optical systems of the incidence-side reflection-type fly-eye optical system (12), and a condensing optical system including two reflecting mirrors (18, 20) that guide illumination light, reflected by the emission-side reflection-type fly-eye optical system (14), to the surface (M). The center of curvature of at least one of the reflecting mirrors is optically eccentric with respect to a normal to the surface for irradiation at the center of the illuminated region.

15 Claims, 8 Drawing Sheets

ILLUMINATION SYSTEMS, EXPOSURE APPARATUS, AND MICRODEVICE-MANUFACTURING METHODS USING SAME

FIELD

This invention pertains to illumination systems, exposure apparatus comprising illumination systems, and microdevice-manufacturing methods performed using the exposure apparatus. The microdevice-manufacturing methods include lithographic processes for manufacturing semiconductor devices, liquid-crystal-display devices, thin-film magnetic heads, and other types of microdevices.

BACKGROUND

In recent years, there has been progress in the commercialization of exposure apparatus that perform exposure by projection, onto a photosensitive substrate, of a mask pattern using extreme ultraviolet (EUV) light in the wavelength range of 5-40 nm as exposure light. In an EUVL (extreme ultraviolet lithography) exposure apparatus, optical materials are limited to materials that exhibit high transmittance at short wavelengths. Consequently, reflective optical systems are used (see, for example, U.S. Pat. No. 6,452,661, corresponding to Japan Laid-open (Kôkai) Patent Document No. Hei 11-312638, incorporated herein by reference).

Figure 9:
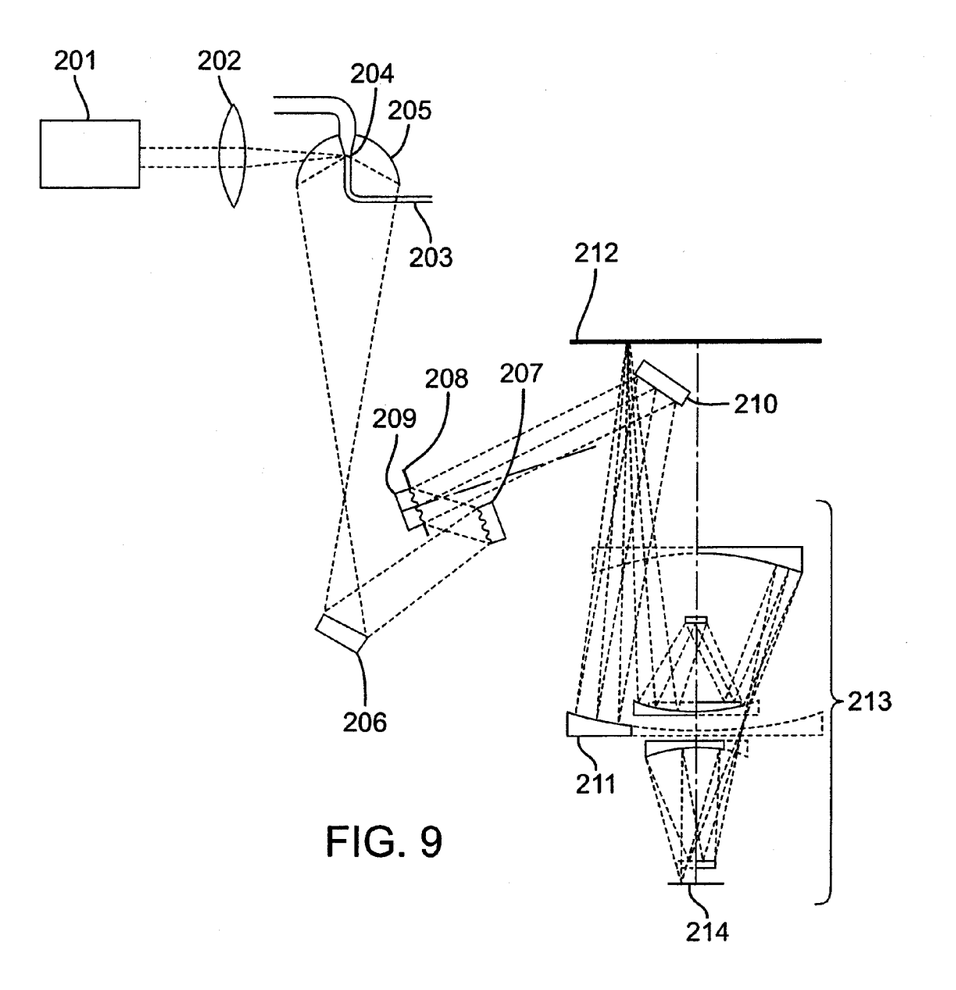
FIG. 9 is an optical diagram of a conventional exposure apparatus.

An exposure apparatus as noted above is exemplified by the prior-art system shown in FIG. 9. A target material, supplied by a nozzle 203, is irradiated at a point 204 with laser light emitted from a non-EUV laser-light source 201 and condensed by a condensing element 202. Thus, the target material receives an intensely concentrated dose of radiant energy that converts the target material into a plasma that generates EUV light. The generated EUV light is condensed by a condensing mirror 205 and reflected by a concave mirror 206. The EUV light then is incident on an incidence-side fly-eye mirror 207, in which numerous concave mirror segments are arranged in rows. The beam reflected by the incidence-side fly-eye mirror 207 passes through a diaphragm aperture 208 and is reflected by an emission-side fly-eye mirror 209, in which numerous concave mirror segments are arranged in rows. The beam again passes through the diaphragm aperture 208 and is incident on an optical assembly 210. The beam reflected by the optical assembly 210 is condensed by a condensing optical assembly 211 for irradiation of a pattern-defining mask 212. The components and systems situated between the point 204 and the mask 212 constitute an "illumination system." The beam carries an image of the pattern defined on the irradiated mask 212 as the beam passes through a projection-optical system 213, which projects the image onto a wafer (photosensitive substrate) 214. Thus, the wafer 214 is exposed with the pattern.

In an illumination system of a conventional exposure apparatus as summarized above, the incidence-side fly-eye mirror 207 and the emission-side fly-eye mirror 209 are separated from each other by a short distance. Consequently, the incidence angle of the beam on the incidence-side fly-eye mirror 207 is large. In an EUVL exposure apparatus, the reflective surfaces of the optical elements typically each include a surficial multilayer film that confers high reflectivity of the surface to incident EUV light. Maximal reflectivity of a multilayer film to EUV light is obtained whenever the EUV light is incident on the multilayer film at a small angle of incidence, i.e., nearly perpendicular to the film.

In the system shown in FIG. 9, to reduce the angle of incidence of EUV light on the incidence-side fly-eye mirror 207, the distance between the incidence-side fly-eye mirror 207 and the emission-side fly-eye mirror 209 must be increased. To accommodate this greater distance, the focal length of the condensing optical assembly 211 would have to be increased, which would result in the condensing optical assembly 211 being situated below the level of the wafer 214 rather than within the projection-optical system 213 as shown in FIG. 9. Because the wafer 214 moves in a scanning direction during exposure, placing the condensing optical assembly 211 below the level of the wafer 214 would cause the wafer 214 to interfere physically with the condensing optical assembly 211. Thus, in a conventional exposure apparatus as shown, it is difficult to satisfy both requirements of: (a) the condensing optical assembly 211 being provided with a long focal length to improve the reflectivity of the fly-eye mirrors, and (b) the distance between the incidence-side fly-eye mirror 207 and the emission-side fly-eye mirror 209 being increased so that EUV light is incident at an angle close to perpendicular on the reflecting surfaces of the incidence-side fly-eye mirror 207.

SUMMARY

In view of the above, this disclosure provides illumination systems that include a condensing optical system or the like are especially suitable for use in extreme ultraviolet lithography (EUVL). Also provided are exposure apparatus including such illumination systems. Also provided are microdevice-manufacturing methods performed using such exposure apparatus.

An embodiment of an illumination system is used for illuminating a surface with illumination light emitted from a light source. The illumination system comprises an incidence-side reflection-type fly-eye optical system (e.g., an incidence-side fly-eye mirror) and an emission-side reflection-type fly-eye optical system (e.g., an emission-side fly-eye mirror). The incidence-side fly-eye optical system comprises multiple reflection-type partial optical systems (e.g., reflective elements, which is the term used herein) positioned in rows. The emission-side fly-eye optical system comprises multiple reflection-type partial optical systems (e.g., reflective elements, which is the term used herein) positioned in rows. The reflective elements of the emission-side fly-eye optical system correspond to respective reflective elements of the incidence-side fly-eye optical system. The illumination system includes a condensing optical system comprising two reflecting mirrors that guide the illumination light, reflected by the emission-side fly-eye optical system, to the surface of a mask for irradiation. In the condensing optical system the center of curvature of at least one of the two reflecting mirrors is optically eccentric with respect to a normal to the irradiated region of the surface at the center of the irradiated region.

In one embodiment of an illumination system, the two reflecting mirrors are spherical mirrors. In an alternative embodiment, the two reflecting mirrors are aspherical mirrors. In yet another alternative embodiment, the two reflecting mirrors comprise a spherical mirror and an aspherical mirror.

Because the center of curvature of at least one of the two reflecting mirrors of the condensing optical system is optically eccentric with respect to the normal to the irradiated region of the surface at the center of the irradiated region, the degrees of freedom of configuration and location of the condensing optical system are increased relative to conventional illumination systems that lack such optical eccentricity. Thus, the condensing optical system can be situated at an optimum position while allowing a substantial increase in the focal length of the condensing optical system and a substantial increase in the interval (distance) between the incidence-side fly-eye optical system and the emission-side fly-eye optical system. Thus, the angles of incidence of illumination light on the incidence-side fly-eye optical system and on the emission-side fly-eye optical system can be made small to improve the reflectivity of the incidence-side fly-eye optical system and the emission-side fly-eye optical system with respect to the illumination light and thus prevent loss of illumination light.

Whenever such an illumination system is employed in an exposure apparatus, the mask surface (and hence the surface of the photosensitive substrate) can be optimally illuminated with exposure light. This preserves the resolution, contrast, and the like of the image formed on the photosensitive substrate, and allows the photosensitive substrate to be exposed with high throughput to the pattern defined by the mask.

The respective inclinations of the reflective elements of the emission-side fly-eye optical system are set such that individual rays, propagating from respective centers of the reflective elements of the incidence-side fly-eye optical system and that have arrived at the respective centers of the reflective elements of the emission-side fly-eye optical system, converge at a point on an irradiated surface (e.g., of the mask) via the condensing optical system.

Using such an illumination system, the respective inclinations of the reflective elements of the emission-side fly-eye optical system are set such that individual rays from each of these reflective elements converge via the condensing optical system at one point on the irradiated surface (e.g., of the mask). I.e., each of the reflective elements of the emission-side fly-eye optical system is inclined (tilted) so as to reflect light toward the center of the fly-eye optical system. The closer to the periphery, the greater the inclination from individual reflective elements. Thus, the fly-eye optical system exhibits a convergent action as if it were acting as a single concave mirror. Thus, the entire emission-side fly-eye optical system has positive power, which serves to converge illumination light reflected by the condensing optical system appropriately on the irradiated surface (e.g., of the mask), which is positioned appropriately for such irradiation. Here, the effective concave-mirror action of the emission-side reflection-type fly-eye optical system is not limited to action that would be exhibited by a spherical concave mirror; the effective concave-mirror action alternatively can be similar to that of an aspherical surface (whether an aspherical surface having no rotational symmetry or a so-called free-form curved surface having no symmetry axis).

According to another aspect, exposure apparatus are provided that are used for transferring a pattern, defined on a mask, onto a photosensitive substrate. An embodiment of such an exposure apparatus comprises an illumination system, as summarized above, for illuminating the mask. The illumination system includes a condensing optical system that is appropriate for use in EUVL. Thus, attenuation of illumination light is prevented, which prevents declines in resolution, contrast, and the like of the image as formed on the photosensitive substrate. These benefits are realized with high throughput.

According to another aspect, microdevice-manufacturing methods are provided that comprise performing exposures of a photosensitive substrate with a pattern defined on a reflective reticle (mask), using an exposure apparatus as summarized above. After exposure the photosensitive substrate is "developed" to preserve the images formed on the photosensitive substrate. In an embodiment of the microdevice-manufacturing method, exposures are performed using an exposure apparatus including an optimal condensing optical system as summarized above. The condensing optical system can be part of an EUVL illumination system, which facilitates the production of microdevices having extremely detailed circuit patterns.

An embodiment of an exposure apparatus generally comprises an incidence-side fly-eye optical system that comprises multiple reflective elements positioned in rows. The exposure apparatus also includes an emission-side fly-eye optical system that comprises multiple reflective elements positioned in rows. The reflective elements of the emission side correspond to respective reflective elements of the incidence side. The exposure apparatus also includes a condensing optical system comprising two reflecting mirrors that guide illumination light, reflected by the emission-side fly-eye optical system, to a surface (e.g., of a mask) for irradiation. In this embodiment the optical axis of the condensing optical system, which passes through the centers of curvature of the two reflecting mirrors of the condensing optical system, is not parallel to the normal to the irradiated surface at the center of the irradiated region.

Another embodiment of an exposure apparatus generally comprises an incidence-side fly-eye optical system, an emission-side fly-eye optical system, and a condensing optical system as summarized above. In this embodiment, a perpendicular line passing through the center of the aperture plane of the emission-side fly-eye optical system is regarded as a virtual optical axis. The optical axis of the condensing optical system, passing through the centers of curvature of the two reflecting mirrors in the condensing optical system, is not parallel to the virtual optical axis. The resulting eccentric configuration of the condensing optical system provides excellent illumination.

Another embodiment of an exposure apparatus generally comprises an incidence-side fly-eye optical system, an emission-side fly-eye optical system, and a condensing optical system as summarized above. In this embodiment, the condensing optical system includes a convex mirror on the incidence side and a concave mirror on the emission side. This condensing optical system provides a compact illumination-optical system while maintaining a large distance (interval) between the two fly-eye optical systems.

With the exposure apparatus as summarized above, the reflective elements of the emission-side fly-eye optical system are individually tilted such that, the more peripheral they are, the greater the angle of inclination of the tilt. Consequently, the emission-side fly-eye optical system is configured to have a convergent action. By using a condensing optical system having a convex mirror and a concave mirror, illumination-optical systems are provided that converge, then diverge, and then converge light passing through them. I.e., the illumination-optical systems have positive, negative, and positive powers. This configuration yields a more compact illumination-optical system.

The eccentric configuration of the condensing optical system provides a high degree of freedom of design, and excellent illumination performance. Also, with an illumination system as summarized above, since at least one of the centers of curvature of the two reflecting mirrors of the condensing optical system is optically eccentric with respect to the normal to the irradiated region of the illuminated at the center of the irradiated region (compared to a case in which there is no optical eccentricity with respect to the normal to the irradiated region), the degree of freedom of design and positioning of the condensing optical system can be increased. Hence, the condensing optical system can be positioned in an optimal position while allowing the focal length of the condensing optical system to be lengthened. Also realized is a lengthening of the distance (interval) between the incidence-side fly-eye optical system and the emission-side fly-eye optical system. I.e., the angles of incidence of illumination light incident on the incidence-side fly-eye optical system and the emission-side fly-eye optical system can be made small, which improves the respective reflectivities of the incidence-side fly-eye optical system and of the emission-side fly-eye optical system to the illumination light. The improved reflectivities prevent attenuation of the illumination light. If such an illumination system is employed in an exposure apparatus, the mask surface (and therefore the surface of the photosensitive substrate) can be illuminated in a more optimal manner. Thus, degradations in resolution, contrast, and the like of the image formed on the photosensitive substrate are prevented. Also achieved are high-throughput exposures of the photosensitive substrate with the detailed pattern formed on the mask.

Also provided are microdevice-manufacturing methods, in which illumination is performed using an illumination system of an EUVL system as summarized above. The illumination system comprises a condensing optical system as summarized above. Thus, attenuation of illumination light is prevented, which prevents loss of resolution, contrast, and the like, and facilitates manufacture of microdevices having extremely detailed circuit patterns.

DETAILED DESCRIPTION

Embodiments of exposure apparatus are described below with reference to the drawings.

Figure 1:
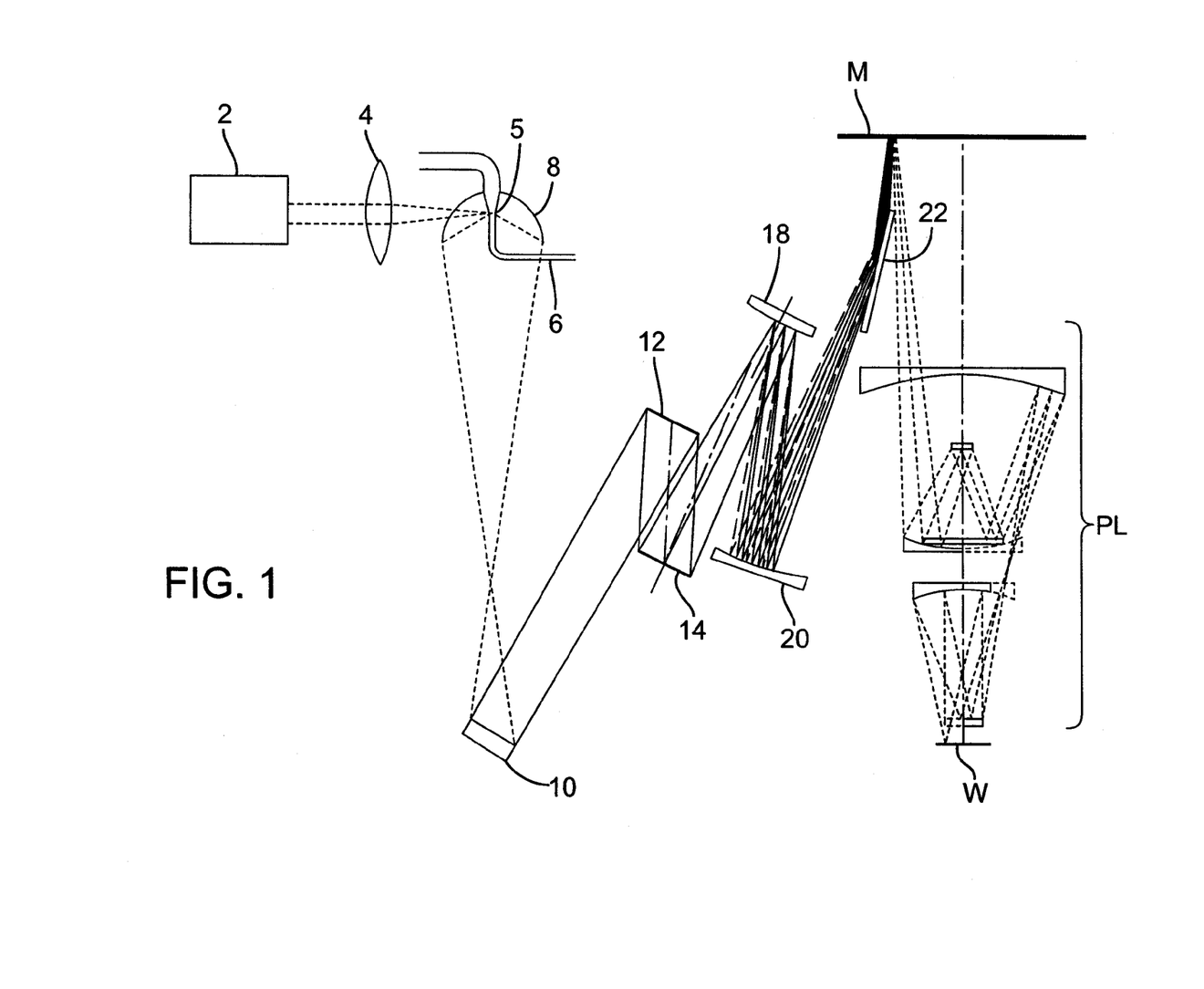
FIG. 1 is an optical diagram of an embodiment of an exposure apparatus.

FIG. 1 shows features of an embodiment of an exposure apparatus. The depicted exposure apparatus uses EUV (extreme ultraviolet) light having a wavelength in the range of approximately 5-40 nm. The apparatus performs exposures in a step-and-scan manner by which an image of a pattern, defined on a mask M, is transferred to a wafer W (photosensitive substrate). The wafer W is "photosensitive" because it has a surficial layer of a photosensitive material (photoresist) applied to it. Exposures are performed while moving the mask M and wafer W relative to the projection-optical system PL. The exposure apparatus includes an illumination system comprising a high-intensity laser-light source 2, a condenser lens 4, a plasma light source 5, a nozzle 6, an elliptical collector mirror 8, a collector mirror 10, an incidence-side fly-eye mirror 12, an emission-side fly-eye mirror 14, and condenser mirrors 18, 20. The illumination system produces a beam of EUV light (illumination light) that is used for irradiating a desired region of the mask M.

In this exposure apparatus, because the transmissivity of air with respect to EUV light is low, the optical path through which the EUV light propagates is enclosed in a vacuum chamber (not shown). Laser light emitted by the high-intensity laser-light source 2 (e.g., a YAG laser under semiconductor-laser excitation, an excimer laser, or other high-output laser) is condensed by the condenser lens 4 to a point (focused point) that serves as the plasma light source 5. Meanwhile, xenon (Xe) gas, krypton (Kr) gas, or other suitable target material is ejected from the nozzle 6 at the focused point illuminated by the condensed laser light. The extremely high intensity of laser light impinging on the target material at the focused point excites the target to a plasma condition. In the plasma, as atoms of the target material undergo transitions to a low-potential state, they produce and emit EUV light, ultraviolet light of wavelength 100 nm and longer, visible light, and light of other wavelengths.

EUV light and the like emitted from the plasma light source 5 is incident on the elliptical collector mirror 8. The collector mirror 8 is positioned such that its first focal point, or vicinity thereof, is coincident with the focused point serving as the plasma light source 5. The inner surface of the collector mirror 8 is coated with a multilayer film comprising multiple alternating layers of EUV-reflective materials. For example, a multilayer film consisting of alternating layers of molybdenum (Mo) and silicon (Si) is suitable for reflecting, from EUV light incident on the multilayer film, EUV light having a wavelength of approximately 13 nm. As another example, a multilayer film of alternating layers of Mo and beryllium (Be) is suitable for reflecting, from EUV light incident on the multilayer film, EUV light having a wavelength of approximately 11 nm. The reflected EUV light is condensed at or near the second focal-point position of the collector mirror 8. This reflected EUV light is incident on the collector mirror 10. The collector mirror 10 includes a substrate of glass, ceramic, metal, or other material, on which is formed a multilayer film (e.g., alternating layers of Mo and Si) to achieve maximal reflection of incident EUV light.

EUV light reflected by the collector mirror 10 is guided to a reflection-type fly-eye optical system that is used as an optical integrator. In the reflection-type fly-eye optical system, the EUV light is first incident on the incidence-side fly-eye mirror 12 (as an exemplary "incidence-side reflection-type fly-eye optical system"), then is incident on the emission-side fly-eye mirror 14 (as an exemplary "emission-side reflection-type fly-eye optical system"). The distance ("interval") between the incidence-side fly-eye mirror 12 and the emission-side fly-eye mirror 14 in this embodiment is greater than in conventional illumination systems. This allows EUV light to be incident, without being physically blocked, at a small angle from the perpendicular (i.e., at a small angle of incidence) on the reflecting surface of the incidence-side fly-eye mirror 12.

Figure 2A:
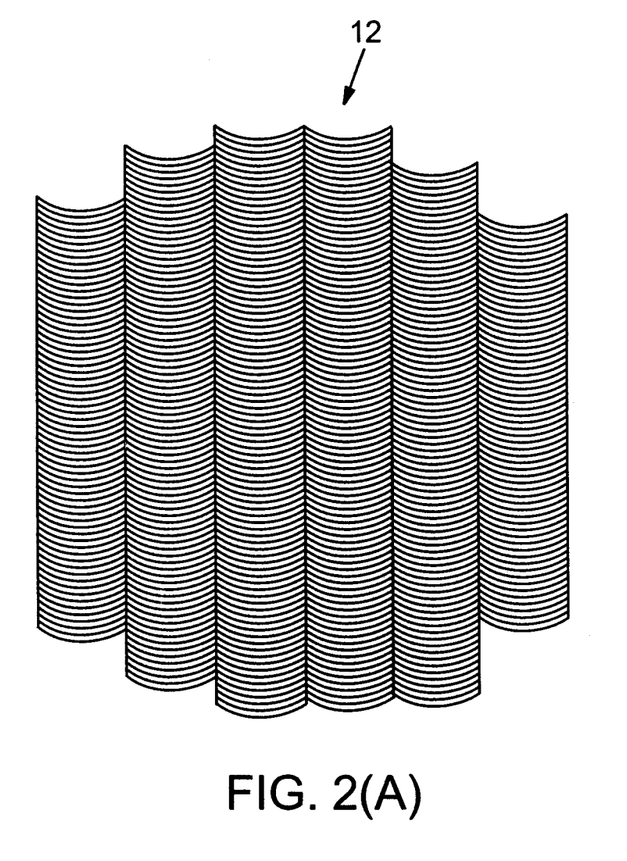
FIG. 2(A) is a plan view of an exemplary configuration of an incidence-side fly-eye optical system used in the embodiment of FIG. 1.

Referring to FIG. 2(A), the incidence-side fly-eye mirror 12 comprises multiple element mirrors (as exemplary "reflective elements"). The element mirrors are concave mirrors arranged densely in two dimensions (including rows). The incidence-side fly-eye mirror 12 is located so as to be optically conjugate (or nearly optically conjugate) to the surface of the mask M and the surface of the wafer W. The reflecting surface of each element mirror of the incidence-side fly-eye mirror 12 comprises a substrate of glass, ceramic, metal, or the like, and a surficial multilayer film (e.g., alternating layers of Mo and Si) to improve its reflectivity to EUV light.

Figure 2B:
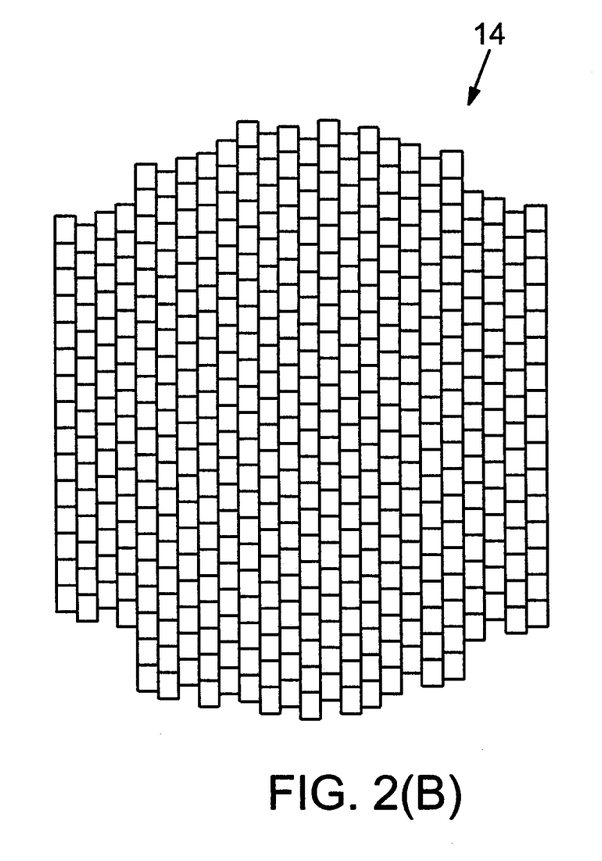
FIG. 2(B) is a plan view of an exemplary configuration of an emission-side fly-eye optical system used in the embodiment of FIG. 1.

The wavefront of EUV light incident to the incidence-side fly-eye mirror 12 is split up by the element mirrors of the incidence-side fly-eye mirror as the EUV light reflects from the element mirrors. The EUV light reflected from the incidence-side fly-eye mirror 12 passes through an aperture stop (not shown) to the emission-side fly-eye mirror 14, on which the EUV light is incident also at an angle close to perpendicular (i.e., a small incidence angle). As shown in FIG. 2(B), the emission-side fly-eye mirror 14 comprises multiple element mirrors, which are concave mirrors ("reflection-type partial optical systems") that are arranged densely in two dimensions (including rows). The emission-side fly-eye mirror 14 is located so as to be optically conjugate (or nearly optically conjugate) to the pupil of the projection-optical system PL, described below. Each element mirror of the incidence-side fly-eye mirror 14 comprises a substrate of glass, ceramic, metal, or the like, and a surficial multilayer film (e.g., alternating layers of Mo and Si) to improve its reflectivity to EUV light. Further details of the configurations of the incidence-side fly-eye mirror 12 and emission-side fly-eye mirror 14 are described in U.S. Pat. Nos. 6,452,661 and 6,833,904, incorporated herein by reference.

In the following discussion the multiple element mirrors of the emission-side fly-eye mirror 14 are also called "emission-side element mirrors," and the multiple element mirrors of the incidence-side fly-eye mirror 12 are also called "incidence-side element mirrors." The respective inclinations of the emission-side element mirrors are set such that respective rays, reflected from the centers of the reflecting surfaces of the incidence-side element mirrors, that have reached the centers of respective reflecting surfaces of the emission-side element mirrors, do not converge on a single point or become collimated (made parallel) without passing through the condensing optical system described below. In other words, the reflecting surfaces of the emission-side element mirrors have respective prescribed inclinations such that respective rays reflected from the centers of the incidence-side element mirrors and reflected by the centers of the emission-side element mirrors (corresponding to the incidence-side element mirrors) are not collimated and do not converge on a single point on the surface of the mask M. Thus, the reflecting surfaces of the element mirrors of the emission-side fly-eye mirror 14 collectively have a convergent action equivalent to the action of an aspherical surface or of a free-form surface, as this fly-eye mirror exhibits an overall function of a concave mirror.

In FIG. 2(A) each of the incidence-side element mirrors has a partial arc shape in the plan view. In FIG. 2(B) each of the emission-side element mirrors has a rectangular shape in the plan view. Thus, respective rays reflected from the same positions on the element mirrors, e.g., respective rays reflected from the centers of the element mirrors, converge at the same point on the mask M.

Figure 3A:
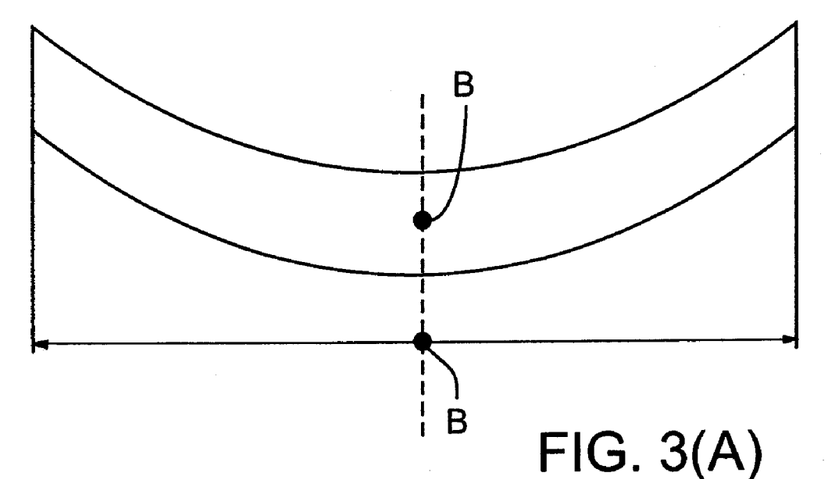
FIG. 3(A) is a plan view of the reflecting surface of an exemplary reflective element of the incidence-side fly-eye optical system.
Figure 3B:
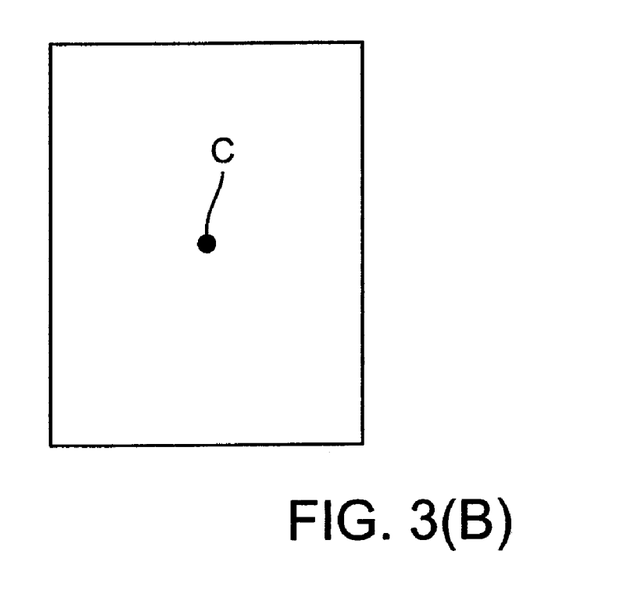
FIG. 3(B) is a plan view of the reflecting surface of an exemplary reflective element of the emission-side fly-eye optical system.

FIG. 3(A) depicts the reflecting surface of one of the element mirrors of the incidence-side fly-eye mirror 12. In an incidence-side element mirror having, for example, an arc shape as shown, the lateral-direction center A about which there is linear symmetry can easily be defined. The center in the vertical direction is defined as the mid-point B between the upper and lower edges of the reflecting surface on the vertical center line (the broken line in the drawing). The mid-point B is the "center" of the incidence-side element mirror. FIG. 3(B) depicts the reflecting surface of one of the element mirrors of the emission-side fly-eye mirror 14. In the figure the center C can easily be defined in an emission-side element mirror having, for example, a rectangular shape.

By making the entire reflective surface of the emission-side fly-eye mirror 14 equivalent to a non-spherical or a free-form curved surface, in contrast to a spherical surface, EUV light reflected by the emission-side fly-eye mirror 14 can be made to converge appropriately on the surface of the mask M, whenever the mask is situated at an optimum position for such convergence.

As noted above, each of the rays resulting from wavefront splitting and reflection of incident EUV light by the element mirrors of the incidence-side fly-eye mirror 12 is incident on a respective element mirror of the emission-side fly-eye mirror 14. Thus, a secondary light source is formed, from the respective individual light-source images produced by the element mirrors, at the reflective surface of the emission-side fly-eye mirror 14 or in the vicinity of that reflective surface. EUV light, from that secondary light source, is reflected by the emission-side fly-eye mirror 14 through an aperture stop (not shown) to the condensing optical system. The aperture stop determines the numerical aperture of the illumination light.

The condensing optical system comprises a first condenser mirror 18 and a second condenser mirror 20. The EUV light from the emission-side fly-eye mirror 14 is incident on the first condenser mirror 18 (a spherically convex mirror). To improve its reflectivity to EUV light, the first condenser mirror 18 comprises a substrate of glass, ceramic, metal, or the like, with a reflective surface coated with a multilayer film (e.g., alternating layers of Mo and Si).

Figure 4:
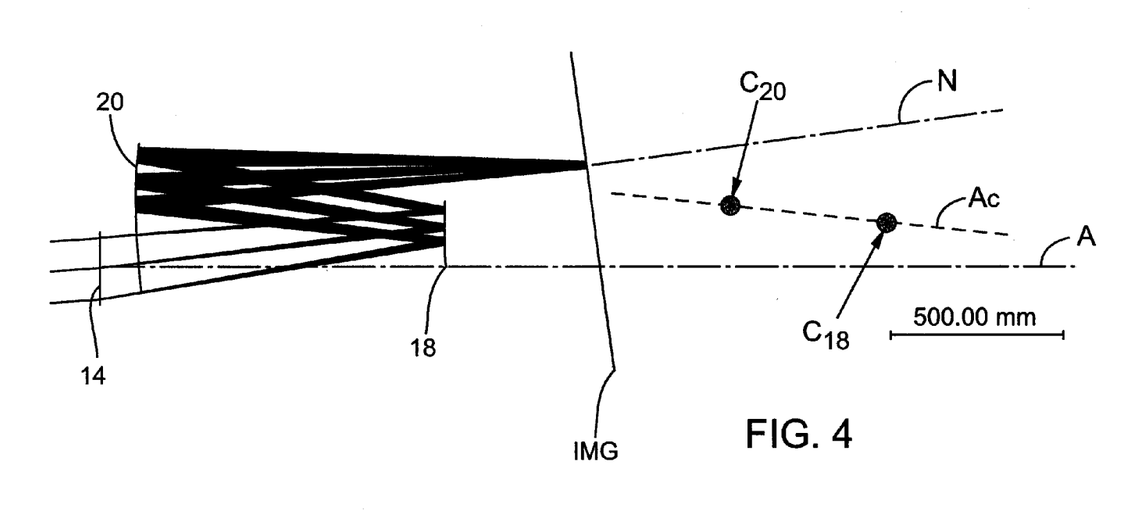
FIG. 4 is a diagram of the optical path associated with an embodiment of a condensing optical system.

As indicated in FIG. 4, the center of curvature $C_{18}$ of the first condenser mirror 18 (having a spherically convex reflective surface) is optically eccentric with respect to the normal N to the irradiated region on the surface of the mask M (IMG) in the center of the irradiated region. Consequently, compared to a situation in which there is no optical eccentricity with respect to the normal N, the degrees of freedom with which the first condenser mirror 18 can be positioned are increased. Here, "optical eccentricity" means that, as indicated in FIG. 4, the center of curvature $C_{18}$ of the first condenser mirror 18 is not on the normal N to the surface of the mask M, even if there is no deflection by the plane mirror 22 (FIG. 1); i.e., even when the beam of light reflected by the plane mirror 22 is expanded, as indicated in FIG. 4.

EUV light incident on the first condenser mirror 18 is reflected by the first condenser mirror 18 and is incident on the second condenser mirror 20 (a spherically concave mirror) of the condensing optical system. The second condenser mirror 20 comprises a substrate of glass, ceramic, metal, or the like, with a reflective surface coated with a multilayer film formed of alternating layers of Mo and Si to improve its reflectivity to EUV light. The center of curvature $C_{20}$ of the condenser mirror 20 is also optically eccentric with respect to the normal N to the mask M surface (IMG) at the center of the irradiated region, as shown in FIG. 4. Consequently, compared to a situation in which there is no optical eccentricity with respect to the normal N, the degrees of freedom with which the condenser mirror 20 can be positioned are increased.

EUV light reflected by the second condenser mirror 20 is reflected and deflected by the plane mirror 22. This reflected and deflected EUV light uniformly illuminates, with superposition, the reflective mask M on which is formed a prescribed circuit pattern. The EUV light reflected by the mask M forms a two-dimensional light-source image at the pupil of the reflection-type projection-optical system PL. The projection-optical system PL projects the pattern image, formed by the mask M, onto the wafer W for exposure. For exposure sensitivity, the wafer W is coated with a resist, thereby forming a photosensitive substrate.

The eccentric configuration of the first condenser mirror 18 (convex) and second condenser mirror 20 (concave) of the condensing optical system, explained above with reference to FIG. 4, was described with the normal N to the mask M surface (IMG) at the center of the illuminated region being regarded as a reference. In optical design, the perpendicular line at the center of the effective aperture-stop plane at the emission-side fly-eye mirror 14 can be defined as a virtual optical axis A (FIG. 4). It is useful to regard this virtual optical axis A as a reference. As indicated in FIG. 4, the center of curvature $C_{18}$ of the convex mirror 18 and the center of curvature $C_{20}$ of the concave mirror 20 are both at eccentric positions relative to the virtual optical axis A. The optical axis Ac of the condensing optical system is effectively defined by the straight line connecting the two centers of curvature $C_{18}$ and $C_{20}$. This eccentric configuration is characterized in that the optical axis Ac of the condensing optical system is not parallel to the normal N to the mask M surface (IMG) at the center of the irradiated region of the mask. The optical axis Ac of the condensing optical system is also not parallel to the virtual optical axis A. If the condensing optical system is configured with the optical axis Ac defined in this way, then there is no need for both the centers of curvature $C_{18}$ and $C_{20}$ of the convex mirror 18 and the concave mirror 20, respectively, to be eccentric with respect to the normal N or the virtual optical axis A, and a configuration is possible in which only one of the two centers of curvature $C_{18}$ and $C_{20}$ is eccentric.

With an exposure apparatus as described above, because the optical axis of the condensing optical system comprising two spherical mirrors 18, 20 is optically eccentric or is not parallel with respect to the normal to the mask surface at the center of the illuminated region of the mask, the degrees of freedom with which the first and second condenser mirrors can be configured and placed can be substantially increased compared to a case in which there is no optical eccentricity with respect to the normal to the mask. In other words, the condensing optical system in this embodiment comprises two reflecting mirrors, which are, in the order in which light arrives, the convex mirror 18 and the concave mirror 20. By appropriately tilting each of the element mirrors of the emission-side fly-eye mirror 14, an effective power (refractive power) results. This power is equivalent to a positive lens (equivalent to a concave mirror).

Figure 5:
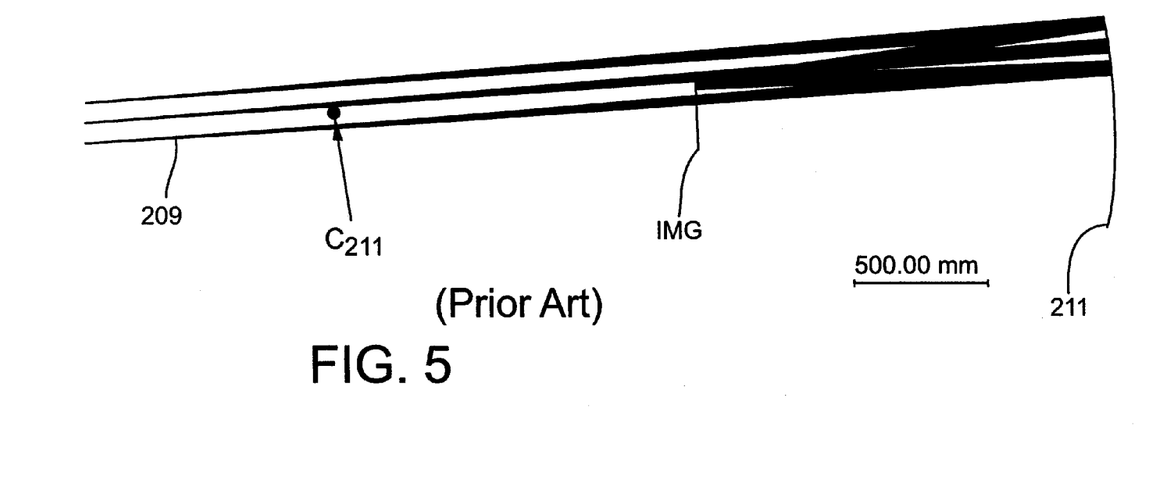
FIG. 5 is a diagram of the optical path associated with a conventional condensing optical system that utilizes a single mirror.

Whereas FIG. 4 shows the optical path of the condensing optical system of an exposure apparatus according to this embodiment, FIG. 5 shows the optical path of a conventional condensing optical system having one concave mirror, such as the system shown in FIG. 9. FIGS. 4 and 5 are drawn to the same scale. In the condensing optical system of this embodiment (FIG. 4) each of the reflecting mirrors is provided with appropriate power. The mirrors are placed so as to form an extremely compact optical system compared to the conventional condensing optical system shown in FIG. 5.

Normally, if the focal length of a single convex lens (thin lens) is f, then the interval (distance) between the object-side focal point and the image-side focal point is 2f. If a positive lens, a negative lens, and a positive lens are combined in a three-lens optical system, the distance between the object-side focal point and the image-side focal point can be reduced to f or less. A condensing optical system, as discussed above, that is telecentric at the mask has an object-side focal point located at the emission plane of the fly-eye optical system and an image-side focal point located at the mask (or at a plane conjugate to the mask), so that the distance between the object-side focal point and the image-side focal point is the entire length of the condensing optical system. As a result, a condensing optical system having a positive-negative-positive power arrangement can be realized that has a long focal length relative to its overall length.

In the optical-path configuration of the conventional condensing optical system shown in FIG. 5, only a single concave mirror 211 is used. If the mirror were replaced with a lens system, the result would be equivalent to an optical system having a single positive lens. On the other hand, in the condensing optical system according to this embodiment (FIG. 4), a convex mirror and concave mirror are arranged, in that order, in the optical path between the fly-eye optical system and the mask. Also, the beam emitted from the emission-side fly-eye mirror is not a parallel beam, but rather a convergent beam. That is, each of the element mirrors of the emission-side fly-eye mirror is tilted slightly relative to the others so that, overall, the emission-side fly-eye mirror exhibits the power of a positive lens. If the two mirrors were replaced with a lens system, the resulting optical system (both fly-eye mirrors and the condensing optical system) would have the power arrangement of a combination of a positive lens, a negative lens, and a positive lens. Compared to the conventional system, the condensing optical system of this embodiment is substantially more compact.

The condensing optical system of this embodiment, despite having a long focal length, can be situated at an optimum position. Also, the distance between the incidence-side fly-eye mirror and emission-side fly-eye mirror can be substantially longer than in a conventional system, allowing the respective angles of incidence of EUV light on the incidence-side fly-eye mirror and emission-side fly-eye mirror to be decreased. This, in turn, allows the reflectivity to EUV light of the incidence-side fly-eye mirror and emission-side fly-eye mirror to be increased relative to conventional systems, with consequent reduced loss of EUV light.

The respective inclinations of the multiple element mirrors of the emission-side fly-eye mirror are set such that the respective rays from the element mirrors converge, via the condensing optical system, at a point on the mask surface. That is, each of the reflective elements of the emission-side fly-eye optical system is provided with an inclination (tilt) such that light is reflected toward the axis of that fly-eye optical system. These individual inclinations are greater toward the periphery of the fly-eye optical system. Thus, the entire emission-side fly-eye optical system has a convergent effect like that of a concave mirror. This allows the mask surface to be illuminated optimally with EUV light (illumination light) in a manner that prevents decreases in resolution, contrast, and the like on the wafer surface. Also, the wafer can be exposed at higher throughput with the fine pattern formed on the mask.

In the exposure apparatus of this embodiment, the condensing optical system comprises two spherical mirrors that, in order from the incident-light side, are convex and concave. Alternatively, both mirrors may be aspherical. Further alternatively, one of the mirrors can be spherical and the other can be aspherical.

In the exposure apparatus of this embodiment, EUV light is used as the exposure light. Alternatively, laser light produced by, e.g., a KrF excimer laser, an ArF excimer laser, or an $F_2$ laser may be used as the exposure light.

Figure 6:
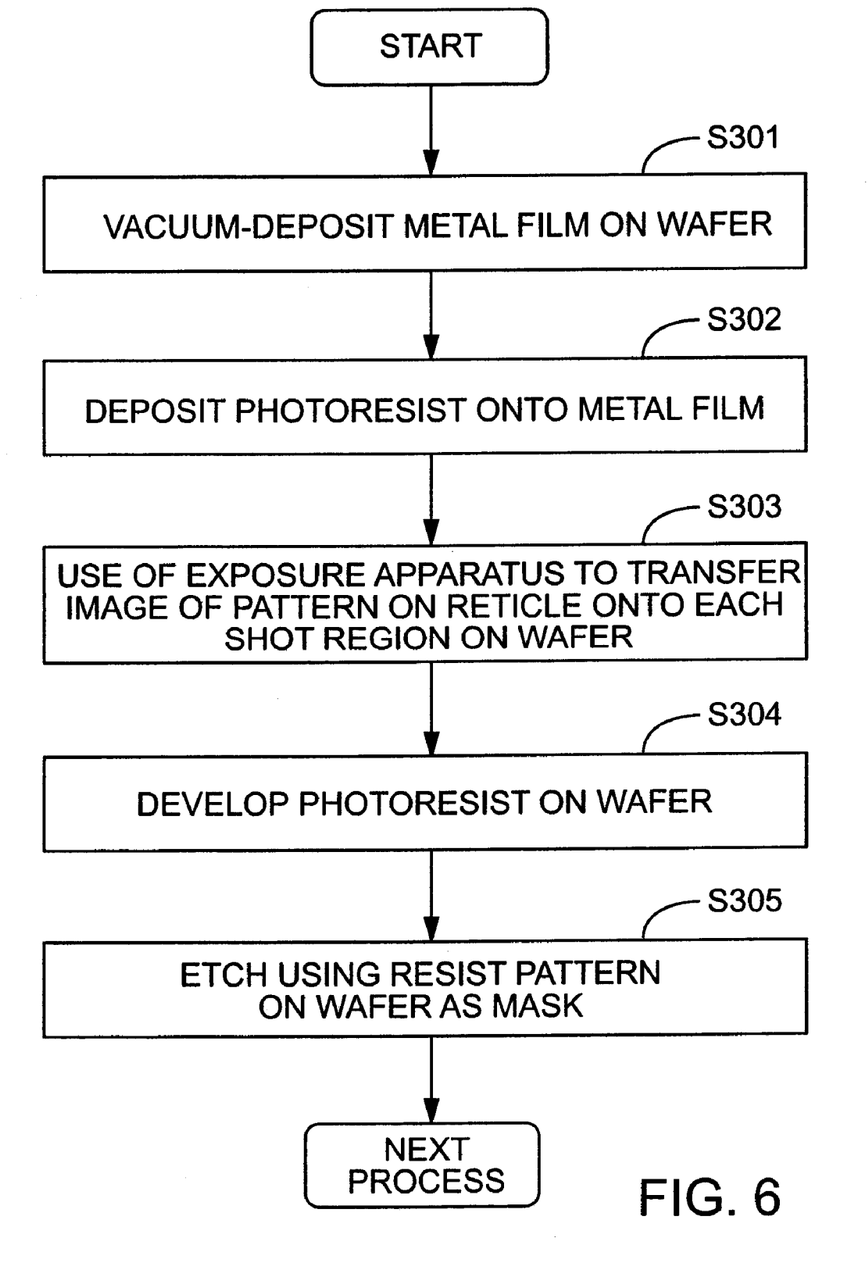
FIG. 6 is a flowchart of an embodiment of a method for manufacturing semiconductor devices, as exemplary microdevices.

In the exposure apparatus of this embodiment, a reticle (mask) is illuminated by the illumination system, and a projection-optical system is used for exposing a photosensitive substrate (wafer) with the pattern defined on the mask. This general lithographic method can be used in the manufacture of microdevices (e.g., semiconductor devices, image-capture devices, liquid-crystal-display devices, thin-film magnetic heads, and the like). FIG. 6 depicts a flowchart of an exemplary method for manufacturing semiconductor devices (as exemplary microdevices). The method includes forming a prescribed circuit pattern on a wafer or similar as a photosensitive substrate using an exposure apparatus such as the embodiment described above. In step S301 a metal film is applied (e.g., by vacuum-evaporation) to a lot of wafers. In step S302 a photoresist is deposited onto the metal film on the lot of wafers. In step S303 an exposure system (such as the embodiment described above) is used to perform lithographic exposures, by which images of the pattern defined on the mask are formed successively in each shot area of the lot of wafers, using the projection-optical system. After developing the photoresist on the lot of wafers in step S304, the lot of wafers is etched (step S305), using the photoresist pattern as a mask, so that a circuit pattern corresponding to the mask pattern is formed in each shot area on each wafer.

By forming additional circuit patterns and the like on other layers, semiconductor devices or other devices are fabricated. In this microdevice-manufacturing method, because exposures are performed using the described embodiment of the exposure apparatus, reduced resolution, contrast, and the like in the images formed on the photosensitive substrate surface can be prevented. Consequently, microdevices having detailed circuit patterns can be produced at higher throughput. In steps S301-S305, metal is vacuum-evaporated onto the wafer, photoresist is deposited onto the metal film, and exposure, development, and etching steps are performed. Prior to these steps a silicon oxide film may be formed, if desired, on the wafer, after which the photoresist is deposited on the silicon oxide film, followed by exposure, development, etching, and other steps.

Figure 7:
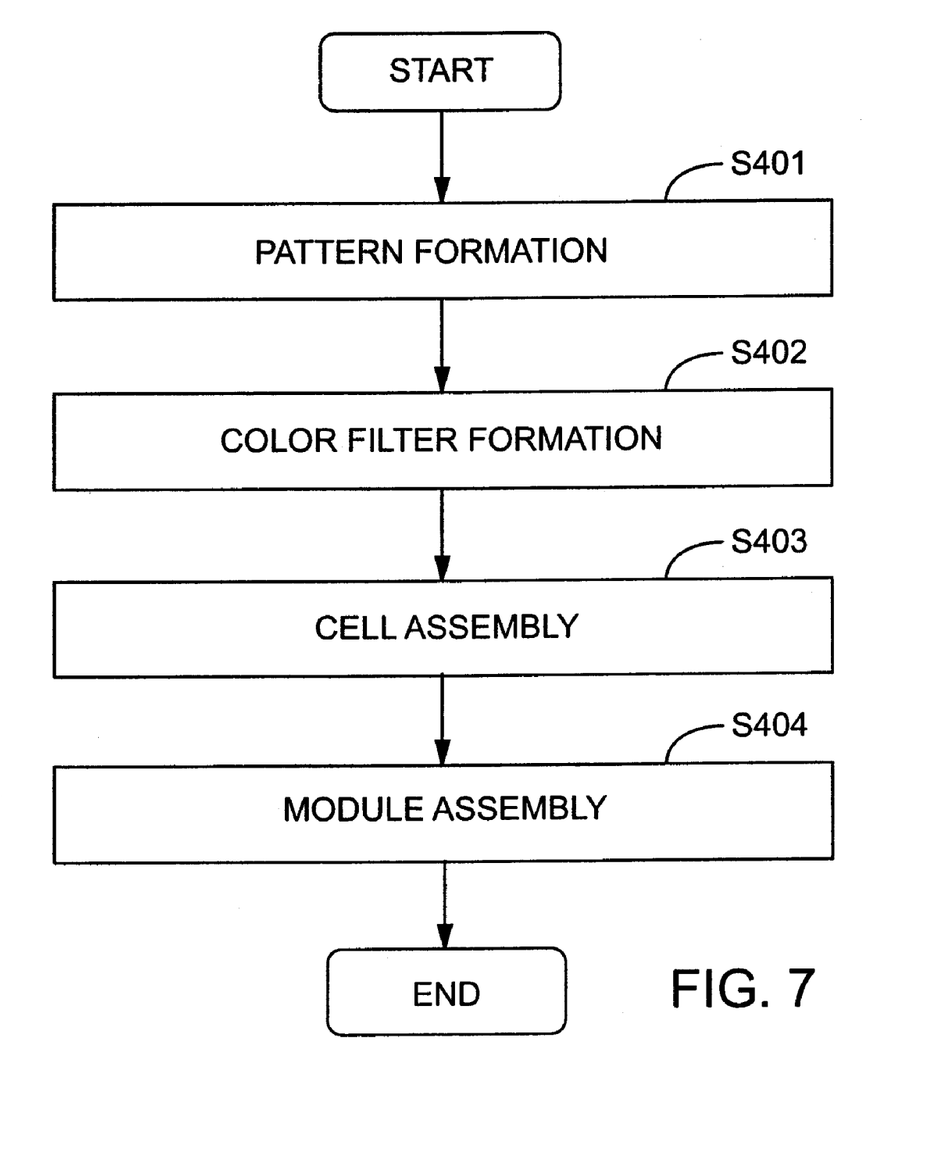
FIG. 7 is a flowchart of an embodiment of a method for manufacturing liquid-crystal-display devices, as exemplary microdevices.

Using the embodiment of the exposure apparatus described above, a prescribed pattern (circuit pattern, electrode pattern, or the like) can be formed on a plate (e.g., glass substrate) so as to imprint a layer of a liquid-crystal-display device (a type of microdevice). An example of such a method is depicted in the flowchart of FIG. 7. In FIG. 7 a so-called lithography process is performed in the pattern-formation step S401, in which the pattern of a mask is transferred (exposed) onto a photosensitive substrate (glass substrate or the like onto which a photoresist has been deposited) using the exposure apparatus. Thus, a prescribed pattern containing numerous electrodes or the like is formed on the photosensitive substrate. The exposed substrate is subjected to a development step, an etching step, a resist-stripping step, and optionally other steps to form the prescribed pattern on the substrate. These steps can be followed by a color-filter-formation step S402.

In the color-filter-formation step S402, multiple groups of three dots corresponding to R (red), G (green), and B (blue) are arranged in a matrix. Alternatively, multiple groups of three R, G, B stripes are arranged in a horizontal scan-line direction, to form a color filter. After the color-filter-formation step S402 a cell-assembly step S403 is executed, in which a substrate having the prescribed pattern formed in step S401, a color filter formed in step S402, and optionally other structures, are assembled into a liquid-crystal panel (comprising multiple liquid-crystal cells). In the cell-assembly step S403, for example, liquid-crystal material is injected into gaps between the substrate (having a prescribed pattern formed in the pattern-formation step S401) and the color filter formed in the color-filter-formation step S402, to fabricate cells of a liquid-crystal panel.

In the module-assembly step S404 electronic circuits required for operating the cells of the liquid-crystal panel, a backlight, and other components are installed, to complete fabrication of the liquid-crystal-display device. By means of the above-described method of manufacture of a liquid-crystal-display device, because exposure is performed using the particular embodiment of exposure apparatus as described above, declines in resolution, contrast, and the like on the photosensitive substrate surface are avoided, and display devices having detailed circuit patterns are produced with high throughput.

EXAMPLE

Figure 8:
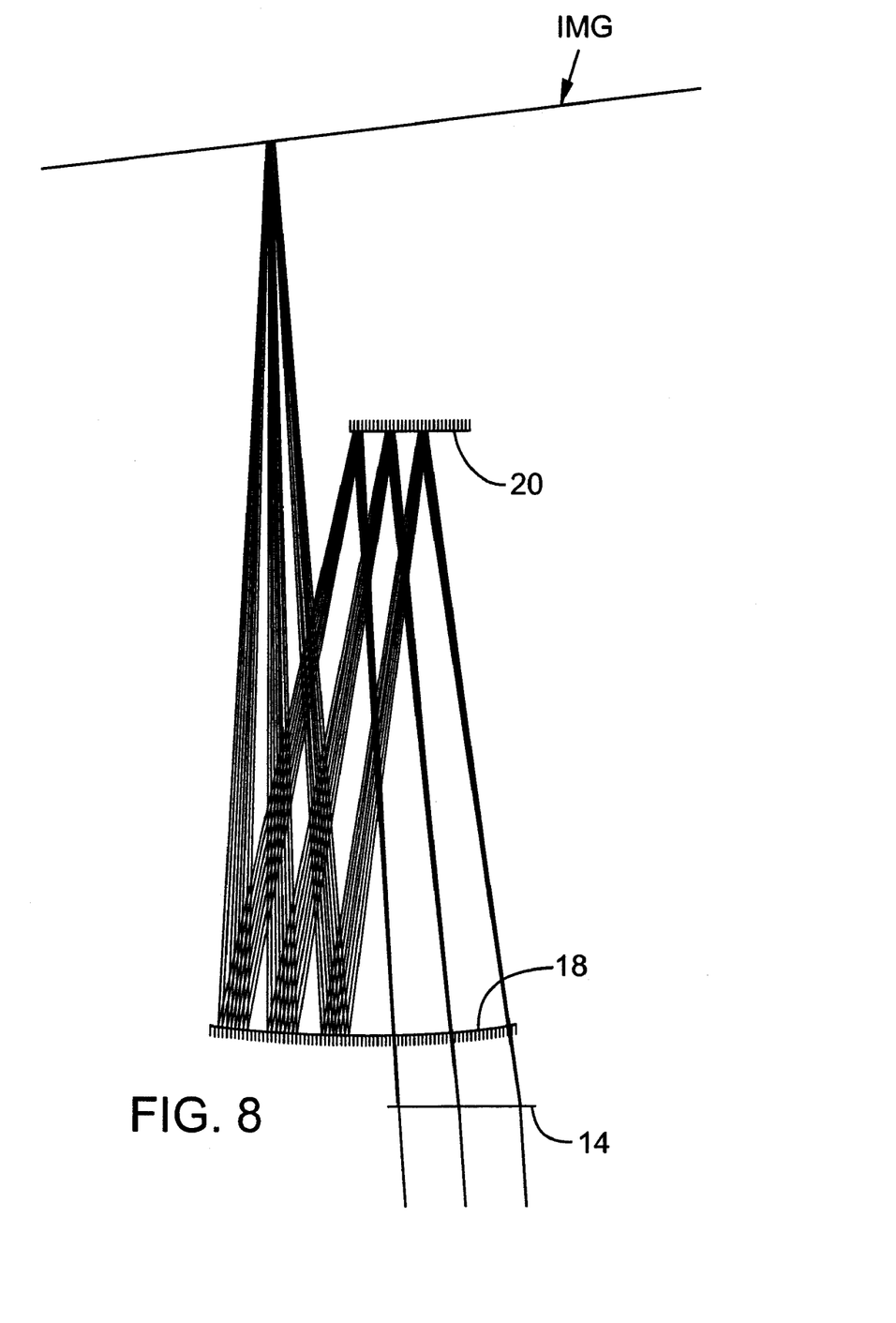
FIG. 8 shows an exemplary ray trace of an embodiment of a condensing optical system.

FIG. 8 shows the configuration of an exemplary emission-side fly-eye mirror 14 and condensing optical system of an illumination system, as well as the position of the surface for irradiation IMG. The configurations of the emission-side fly-eye mirror 14 and of the condensing optical system of this example are as described for the emission-side fly-eye mirror 14 and condenser mirrors 18, 20 of the embodiment shown in FIG. 1. Consequently, the reference symbols used in the following description are as used above in the description of the FIG.-1 embodiment.

Data for the emission-side fly-eye mirror 14 and condenser mirrors 18, 20 of the illumination system of this embodiment are provided according to the format used in CODE V (Optical Research Associates, Pasadena, Calif.), a type of optical-design software. In the CODE V design protocol, the virtual optical axis A (FIG. 4) is regarded as the optical axis in the design process, and the optical data provided below are based on this approach.

First, conditions for rays caused to be incident on the illumination system of this example are described. In the following data, "EPD" is the diameter of the beam caused to be incident on the illumination system, "DIM" is the unit of length used, and "WL" indicates the wavelength of light rays used. The direction of the beam caused to be incident on the illumination system also is indicated. When Cartesian coordinates are used (with the Z-axis being the optical axis of the optical system), "XAN" is the X-direction component of the angle made by the optical axis of the optical system, and "YAN" is the Y-direction component of the angle made by the optical axis. In this embodiment, 15 rays, each at a different angle with respect to the optical axis, are incident on the optical system.

Ray Conditions:
EPD 166.40000
DIM mm
WL 13.50 nm

TABLE 1

| (Direction of beam incidence) | | | | | |
|---|---|---|---|---|---|
| XAN | 0.00000 | 0.00000 | 0.00000 | 0.46553 | 0.46553 |
|  | 0.46553 | 0.93110 | 0.93110 | 0.93110 | 1.39672 |
|  | 1.39672 | 1.39672 | 1.86244 | 1.86244 | 1.86244 |
| YAN | 4.73228 | 4.87602 | 5.01980 | 4.70990 | 4.85364 |

TABLE 1-continued (Direction of beam incidence)

| 4.99806 | 4.64215 | 4.78588 | 4.93226 | 4.52707 |
| 4.67077 | 4.82061 | 4.36106 | 4.50473 | 4.65987 |

Next, specifications for the emission-side fly-eye mirror 14 and condenser mirrors 18, 20 of this example are provided. The specifications are, in order from the left: surface number, surface radius of curvature (mm), distance to the next surface (mm), and material of the optical member. Also, "OBJ" denotes the object plane, "STO" is the aperture-stop plane, "INFINITY" is infinity (e.g., when the radius of curvature is INFINITY, the surface is a plane), and "IMG" is the image plane (irradiated surface). Further, "SPS XYP" is a free-form surface represented by a power series in the XY plane (i.e., a SPS XYP-XY polynomial aspherical surface). The SPS XYP surface includes 10th-order polynomial surfaces based on conics; the polynomial equation is expanded as $x^m y^n$ ($m+n \leq 10$). The following Equation (1) is an equation for the SPS XYP surface (aspherical surface equation).

$$z = \frac{cr^2}{1 + \sqrt{1 - (1+k)c^2 r^2}} + \sum_{j=2}^{66} C_j x^m y^n \quad \text{(Equation (1))}$$

in which z is the distance (sag amount) along the optical axis (Z-axis) of the emission-side fly-eye mirror 14, c is the vertex radius of curvature, K is the conic constant, and $C_j$ are the $x^m y^n$ SCO coefficients. Further, $j=[(m+n)^2+m+3n]/2+1$.

In the optical-member specifications, the SCO coefficient $C_1$ is the conic constant K, $C_2$ is the y coefficient Y, $C_4$ is the $x^2$ coefficient X2, $C_6$ is the $y^2$ coefficient Y2, $C_8$ is the $x^2 y$ coefficient X2Y, $C_{10}$ is the $y^3$ coefficient Y3, $C_{11}$ is the $x^4$ coefficient X4, $C_{13}$ is the $x^2 y^2$ coefficient X2Y2, $C_{15}$ is the $y^4$ coefficient Y4, $C_{17}$ is the $x^4 y$ coefficient X4Y, $C_{19}$ is the $x^2 y^3$ coefficient X2Y3, and $C_{21}$ is the $y^5$ coefficient Y5.

Further, XDE, YDE, ZDE, ADE, BDE, CDE denote surface eccentricities, wherein "XDE" is the X-direction shift (mm), "YDE" is the Y-direction shift (mm), "ZDE" is the Z-direction shift (mm), "ADE" is the rotation (degrees) about the X-axis, "BDE" is the rotation (degrees) about the Y-axis, and "CDE" is the rotation (degrees) about the Z-axis.

Whenever eccentricity occurs in a certain surface, from the next surface eccentricity and the like are represented according to new coordinates after the eccentricity is included. But, for surfaces denoted by "DAR," eccentricity is represented independently, regardless of the eccentricity and the like of the surface preceding the surface denoted by DAR. Also, whenever a surface is denoted by "REFL," the surface is a reflecting surface. Exemplary data are provided in Table 2, below.

TABLE 2

(Optical member specifications)

| OBJ: | INFINITY | INFINITY | | |
|---|---|---|---|---|
| STO: | INFINITY | 0.000000 | | |
| 2: | 23357253.023 | 0.000000 | 'kasou' | |
| SPS XYP | K: −1.2615E+08 | Y: −2.8043E−06 | X2: −1.8313E−08 | |
| SCO | Y2: −1.8560E−08 | X2Y: 1.6132E−12 | Y3: 1.6118E−12 | |
| | X4: −4.2860E−16 | X2Y2: −6.9295E−16 | Y4: −3.6733E−16 | |
| | X4Y: −2.8616E−19 | X2Y3: −6.0085E−19 | Y5: −2.3244E−19 | |
| 3: | −23357253.02 | 969.999967 | | |
| 4: | 1281.70038 | −870.000000 | REFL | |
| | XDE: 0.000000 | YDE: 80.427242 | ZDE: 0.000000 | DAR |
| | ADE: 0.000000 | BDE: 0.000000 | CDE: 0.000000 | |
| 5: | 1691.15218 | 1300.000000 | REFL | |
| | XDE: 0.000000 | YDE: 134.242815 | ZDE: 0.000000 | DAR |
| | ADE: 0.000000 | BDE: 0.000000 | CDE: 0.000000 | |
| 6: | INFINITY | 0.000000 | | |
| | XDE: 0.000000 | YDE: 144.442224 | ZDE: 0.000000 | |
| | ADE: 7.313410 | BDE: 0.000000 | CDE: 0.000000 | |
| IMG: | INFINITY | 0.000000 | | |

Among the optical members of this embodiment, each of the element mirrors of the emission-side fly-eye mirror 14 is configured so as to have a prescribed inclination, such that the EUV light emitted from the respective element mirrors of the emission-side fly-eye mirror 14 converges at a point of the image plane IMG via the condenser mirrors 18, 20, and such that the entire emission-side fly-eye mirror 14 has a positive power equivalent to a free-form curve. However, because it is not possible to represent in CODE V an emission-side fly-eye mirror 14 having power equivalent to such a free-form curve, the free-form surface of the emission-side fly-eye mirror 14 is represented by virtually providing a virtual free-form surface lens ("kasou"), formed from glass having an extremely high refractive index. The refractive index of the virtual free-form surface lens is 10,000.

By means of an illumination system of this embodiment, the respective centers of curvature of the convex mirror 18 and concave mirror 20 of the condensing optical system are optically eccentric with respect to the normal at the center of the illuminated region, as shown in FIG. 4. Thus, the degrees of freedom in the design and in the positioning of the condenser mirrors 18, 20 can be increased. Also, the inclinations of the multiple element mirrors of the emission-side fly-eye mirror 14 are set such that, for each of the multiple element mirrors of the fly-eye mirror 14, individual rays converge on one point on the image surface IMG via the condenser mirrors 18, 20. In addition, the emission-side fly-eye mirror 14 can be configured so as to have a positive-power profile that is equivalent to a free-form curve. Hence the beam reflected by the condenser mirrors 18, 20 can be made to converge appropriately on the surface for irradiation (image surface IMG), positioned at an optimal position.

FEASIBILITY OF INDUSTRIAL APPLICATION

Illumination systems, exposure apparatus, and microdevice-manufacturing methods as described above are appropriate for use in the manufacture of high-performance semiconductor devices, liquid-crystal-display devices, thin-film magnetic heads, and other microdevices.

I claim:

1. An illumination system for illuminating a region of a surface with illumination light emitted from a light source, the system comprising:
    an incidence-side reflection-type fly-eye optical system comprising multiple first reflective elements arranged in rows;
    an emission-side reflection-type fly-eye optical system comprising multiple second reflective elements arranged in rows such that each second reflective element corresponds to and receives illumination light from a respective first reflective element of the incidence-side reflection-type fly-eye optical system; and
    a condensing optical system comprising two reflective mirrors that guide the illumination light, reflected by the emission-side reflection-type fly-eye optical system, to the region of the surface, wherein at least one of the reflective mirrors has a center of curvature that is optically eccentric with respect to a normal to the surface at the center of the illuminated region.

2. The system of claim 1 wherein the two reflective mirrors are spherical mirrors.

3. The system of claim 1 wherein the two reflective mirrors are aspherical mirrors.

4. The system of claim 1 wherein the two reflecting mirrors are a spherical mirror and an aspherical mirror, respectively.

5. The system of claim 1 wherein:
    each of the first reflective elements has a respective effective reflecting surface having a respective center and a respective inclination;
    each of the second reflective elements has a respective effective reflecting surface having a respective center and a respective inclination; and
    the inclinations of the second reflective elements are set such that rays of the illumination light, propagating from the respective centers of the respective effective reflecting surfaces of the first reflective elements and reflecting from the respective centers of the respective effective reflecting surfaces of the second reflective elements, are converged by the condensing optical system at a point in the region of the surface.

6. An exposure apparatus for transferring a pattern from a mask onto a photosensitive substrate, the apparatus comprising an illumination system as recited in claim 1 situated and configured to illuminate the mask.

7. A method for manufacturing microdevices, comprising:
    exposing a photosensitive substrate to a pattern defined on a reflective reticle, using an exposure apparatus as recited in claim 6; and
    developing the exposed photosensitive substrate.

8. An exposure apparatus, comprising:
    an illumination system situated and configured to illuminate a region of a surface with illumination light emitted from a light source, the illumination system comprising (i) an incidence-side reflection-type fly-eye optical system comprising multiple first reflective elements arranged in rows, (ii) an emission-side reflection-type fly-eye optical system comprising multiple second reflective elements arranged in rows, wherein each second reflective element corresponds to and receives illumination light from a respective first reflective element of the incidence-side reflection-type fly-eye optical system, and (iii) a condensing optical system comprising two reflecting mirrors that guide the illumination light, reflected by the emission-side reflection-type fly-eye optical system, to the region of the surface;
    wherein (iv) the two reflecting mirrors have respective centers of curvature, and (v) the condensing optical system has an optical axis that passes through the centers of curvature of the two reflecting mirrors but is not parallel to a normal to the region of the surface at the center of the region.

9. An exposure apparatus, comprising:
    an illumination system situated and configured to illuminate a region of a surface with illumination light emitted from a light source, the illumination system comprising (i) an incidence-side reflection-type fly-eye optical system comprising multiple first reflective elements arranged in rows, (ii) an emission-side reflection-type fly-eye optical system comprising multiple second reflective elements arranged in rows, wherein each second reflective element corresponds to and receives illumination light from a respective first reflective element of the incidence-side reflection-type fly-eye optical system, and (iii) a condensing optical system comprising two reflecting mirrors that guide the illumination light, reflected by the emission-side reflection-type fly-eye optical system, to the region of the surface;
    wherein (iv) the condensing optical system has an optical axis, the two reflecting mirrors have respective centers of curvature, (v) the emission-side reflection-type fly-eye optical system has an aperture plane, (vi) a perpendicular line passing through a center of the aperture plane is a virtual optical axis, and (vii) the optical axis of the condensing optical system passing through the centers of curvature of the two reflecting mirrors of the condensing optical system is not parallel to the virtual optical axis.

10. An exposure apparatus, comprising an illumination system situated and configured to illuminate a region of a surface with illumination light emitted from a light source, the illumination system comprising (i) an incidence-side reflection-type fly-eye optical system comprising multiple first reflective elements arranged in rows, (ii) an emission-side reflection-type fly-eye optical system comprising multiple second reflective elements arranged in rows, wherein each second reflective element corresponds to and receives illumination light from a respective first reflective element of the incidence-side reflection-type fly-eye optical system, and (iii) a condensing optical system that guides the illumination light, reflected by the emission-side reflection-type fly-eye optical system, to the region of the surface, the condensing optical system comprising an incidence-side convex mirror and an emission-side concave mirror.

11. The exposure apparatus of claim 10 wherein:
    the emission-side reflection-type fly-eye optical system has a periphery;
    the first reflective elements of the emission-side reflection-type fly-eye optical system have respective inclination angles;
    the closer to the periphery, the greater the inclination angles; and
    the entire emission-side reflection-type fly-eye optical system has a convergent action.

12. The exposure apparatus of claim 11 wherein:
    the convex mirror and concave mirror have respective centers of curvature; and at least one of the centers of curvature is optically eccentric with respect to a normal to the region of the surface at the center of the region.

13. The exposure apparatus of claim 11 wherein:

the convex mirror and concave mirror have respective centers of curvature;

the emission-side reflection-side fly-eye optical system has an aperture plane;

a perpendicular line passing through a center of the aperture plane is a virtual optical axis; and at least one of the centers of curvature is eccentric with respect to the virtual optical axis.

14. The exposure apparatus of claim 11 wherein:

the condensing optical system has an optical axis;

the convex mirror and concave mirror have respective centers of curvature; and the optical axis, passing through the respective centers of curvature of the convex mirror and the concave mirror, is not parallel to a normal to the region of the surface at the center of the region.

15. The exposure apparatus of claim 11 wherein:

the condensing optical system has an optical axis;

the convex mirror and concave mirror have respective centers of curvature;

the emission-side reflection-side fly-eye optical system has an aperture plane;

a perpendicular line passing through a center of the aperture plane is a virtual optical axis; and the optical axis, passing through the respective centers of curvature of the convex mirror and the concave mirror, is not parallel to the virtual optical axis.

* * * * *

US007446856C1

(12) INTER PARTES REEXAMINATION CERTIFICATE (586th)

United States Patent
Komatsuda (10) Number: US 7,446,856 C1
(45) Certificate Issued: Apr. 29, 2013

(54) ILLUMINATION SYSTEMS, EXPOSURE APPARATUS, AND MICRODEVICE-MANUFACTURING METHODS USING SAME (75) Inventor: Hideki Komatsuda, Ageo (JP)

(73) Assignee: Nikon Corporation, Chiyoda-ku, Tokyo (JP)

Reexamination Request:
No. 95/001,666, Jun. 20, 2011

Reexamination Certificate for:
Patent No.: 7,446,856
Issued: Nov. 4, 2008
Appl. No.: 11/281,785
Filed: Nov. 16, 2005

(30) Foreign Application Priority Data

Nov. 17, 2004 (JP) .................................. 2004-332769

(51) Int. Cl.
*G03B 27/54* (2006.01)
*G03B 27/42* (2006.01)

(52) U.S. Cl.
USPC ............................................. 355/67; 355/53

(58) Field of Classification Search
None
See application file for complete search history.

(56) References Cited

To view the complete listing of prior art documents cited during the proceeding for Reexamination Control Number 95/001,666, please refer to the USPTO's public Patent Application Information Retrieval (PAIR) system under the Display References tab.

*Primary Examiner* — Christina Y Leung (57) ABSTRACT

Illumination systems are disclosed that illuminate a surface (M) for irradiation with illumination light emitted from a light source (5). An exemplary illumination system includes an incidence-side reflection-type fly-eye optical system (12) having multiple reflection-type partial optical systems arranged in rows, an emission-side reflection-type fly-eye optical system (14) having multiple reflection-type partial optical systems arranged in rows and corresponding to respective reflection-type partial optical systems of the incidence-side reflection-type fly-eye optical system (12), and a condensing optical system including two reflecting mirrors (18, 20) that guide illumination light, reflected by the emission-side reflection-type fly-eye optical system (14), to the surface (M). The center of curvature of at least one of the reflecting mirrors is optically eccentric with respect to a normal to the surface for irradiation at the center of the illuminated region.

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-15 are cancelled.

New claims 16-19 are added and determined to be patentable.

*16. An illumination system for illuminating a region of a surface with illumination light emitted from a light source, wherein the surface defines an incidence-side volume and a non-incidence-side volume, the system comprising:*

*an incidence-side reflection-type fly-eye optical system comprising multiple first concave, arc-shaped reflective elements arranged in rows;*

*an emission-side reflection-type fly-eye optical system comprising multiple second concave, rectangular-shaped reflective elements arranged in rows such that each second reflective element corresponds to and receives illumination light from a respective first reflective element of the incidence-side reflection-type fly-eye optical system, wherein the emission-side reflection-type fly-eye optical system defines an aperture plane and is situated such that a perpendicular line passing through a center of the aperture plane is a virtual optical axis;*

*a condensing optical system comprising two reflective mirrors that guide the illumination light, reflected by the emission-side reflection-type fly-eye optical system, to the region of the surface, wherein the reflective mirrors have respective centers of curvature and the condensing optical system has an optical axis that passes through the centers of curvature of the reflective mirrors, and wherein the condensing optical system is situated within the incidence-side volume; and*

*wherein at least one of the centers of curvature is optically eccentric with respect to a normal to the surface at the center of the illuminated region, at least one of the centers of curvature is positioned between the normal and the virtual optical axis, and the optical axis and the virtual optical axis extend to intersect in the non-incidence-side volume.*

*17. The illumination system of claim 16, wherein the virtual optical axis and the normal extend to intersect in the incidence-side volume.*

*18. The illumination system of claim 17, wherein the optical axis and the normal extend to intersect in the incidence-side volume.*

*19. The illumination system of claim 16, wherein the optical axis and the normal extend to intersect in the incidence-side volume.*

\* \* \* \* \*